United States Patent [19]

Bacrania et al.

[11] Patent Number: 4,665,327
[45] Date of Patent: May 12, 1987

[54] CURRENT TO VOLTAGE INTERFACE

[75] Inventors: Kanti Bacrania, Palm Bay; Frank R. Cooper, West Melbourne, both of Fla.

[73] Assignee: Harris Corporation, Melbourne, Fla.

[21] Appl. No.: 625,222

[22] Filed: Jun. 27, 1984

[51] Int. Cl.[4] .................. H03K 19/092; H03K 17/04; H03K 17/10; H03K 17/16

[52] U.S. Cl. .................................... 307/475; 307/260; 307/494; 307/446; 307/443; 307/264; 330/264

[58] Field of Search ............... 307/475, 443, 446, 494, 307/495–500, 544, 558, 570, 270, 601, 608, 254, 264, 260, 451, 261, 262; 330/264, 263

[56] References Cited

U.S. PATENT DOCUMENTS

| | | | |
|---|---|---|---|
| 3,657,563 | 4/1972 | Davis | 328/151 |
| 3,921,089 | 11/1975 | Tsurushima | 330/264 |
| 3,968,451 | 7/1976 | Kamimura et al. | 330/264 |
| 4,015,212 | 3/1977 | Miyata | 330/264 |
| 4,057,796 | 11/1977 | Hoogendoorn et al. | 307/260 X |
| 4,075,509 | 2/1978 | Redfern | 307/240 |
| 4,104,735 | 8/1978 | Hofmann et al. | 307/475 X |
| 4,216,435 | 8/1980 | Ahmed | 330/254 |
| 4,284,910 | 8/1981 | Hofmann et al. | 307/260 X |
| 4,358,689 | 11/1982 | Jarrett et al. | 307/475 |
| 4,450,371 | 5/1984 | Bismarck | 307/475 |
| 4,453,095 | 6/1984 | Wrathall | 307/446 X |
| 4,477,736 | 10/1984 | Onishi | 307/475 X |
| 4,500,849 | 2/1985 | Nakayama | 330/264 X |
| 4,546,275 | 10/1985 | Pena-Finol et al. | 307/498 |
| 4,558,239 | 12/1985 | Kim et al. | 307/494 |
| 4,567,384 | 1/1986 | Stuhlmiller | 307/443 X |

OTHER PUBLICATIONS

RCA Solid State Division, "Linear Integrated Circuits and MOSFET's", p. 279, 1977.

Primary Examiner—Stanley D. Miller
Assistant Examiner—David R. Bertelson
Attorney, Agent, or Firm—Barnes & Thornburg

[57] ABSTRACT

A current-to-voltage interface circuit produces a first logic level voltage at an output in response to current flowing in a first input, and a second logic level voltage at the output in response to current flowing in a second input. The interface circuit has an input stage and a logic stage. The input stage has a first circuit (which includes a current input, a current source and voltage clamp, and a voltage output), a second circuit (which includes a current input, a current source and voltage clamp, and a voltage output), and a switching device connected to the logic stage input and to the two voltage outputs. The logic level voltages are produced at the output of the logic stage in response to the voltage changes at the logic stage input. The circuit transition and recovery times can be easily adjusted by proper selection of circuit components to minimize switching delays associated with decision making transitions. In a preferred combination, the interface circuit is connected to a comparator which has first and second current outputs and a preferential state in which current flows in the first current output.

35 Claims, 3 Drawing Figures

U.S. Patent May 12, 1987 4,665,327
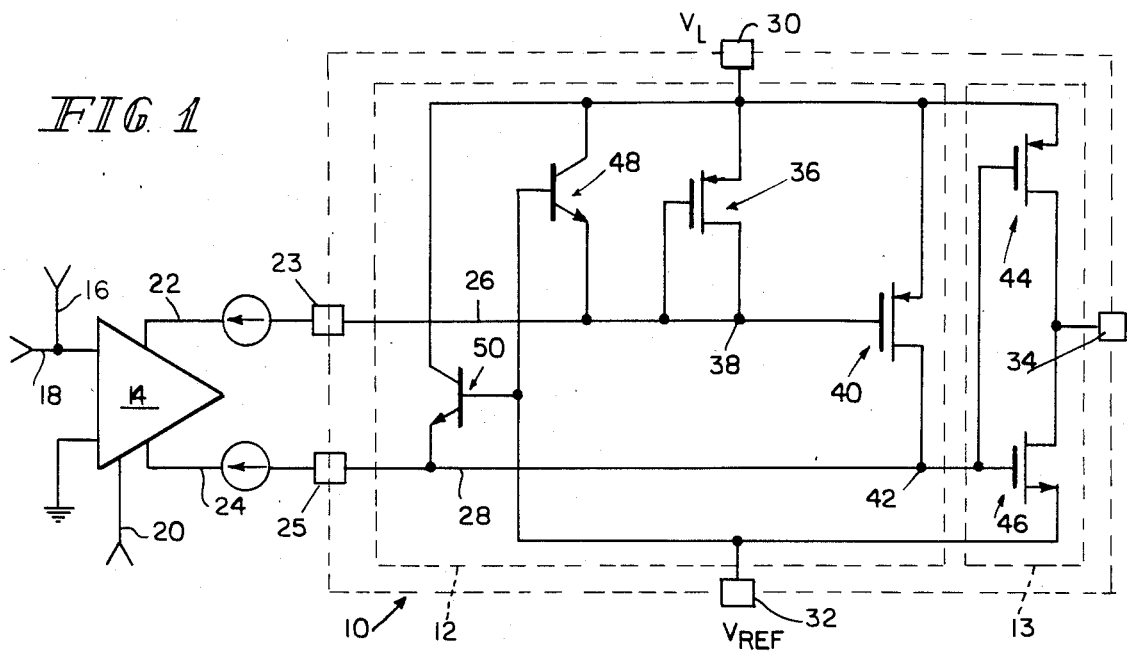
*FIG. 1*
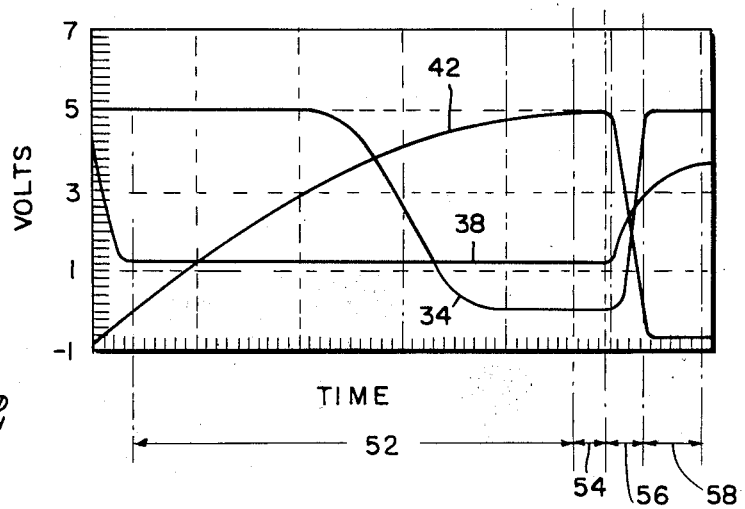
*FIG. 2*
*FIG. 3*

CURRENT TO VOLTAGE INTERFACE

BACKGROUND AND SUMMARY OF THE INVENTION

This invention relates to a current-to-voltage interface circuit for translating the current output of a device to a logic level voltage for interfacing to a logic circuit.

In logic systems, it is often advantageous to use devices which produce outputs in the form of current, rather than voltage, signals. Transmission of current signals from one circuit to another can be accomplished with relatively small voltage levels. This reduces the potential for noise generation in the circuit due to capacitive coupling between connecting leads. This is especially important in chip-to-chip signal transmission where lead lengths are relatively long.

An example of such an application is the use of a high speed analog comparator, having current signal inputs and outputs, in an analog to digital converter (Harris Corp. part number HI574A). This comparator has an input current terminal, a reference current terminal, a strobe terminal, and first and second output current terminals. Under normal conditions, the strobe is inactive and the output stage of the comparator goes into a preferential state in which it sinks a constant current of approximately 500 microamps through the first current output, while no current flows in the second current output. When the strobe is activated, the comparator assumes one of two states: (1) if the input current is greater than the reference current, the output stage remains in the preferential state, with currents flowing in the first and second current output as stated above; (2) if the input current is less than the reference current, the output stage switches the current flows such that a constant current of approximately 500 microamps is sunk through the second current output, while no current flows in the first current output. When the strobe is active, the comparator inputs are disabled and the outputs remain in the state mandated by the condition of the inputs when the strobe was activated. When the strobe is inactive, the output stage of the comparator returns to the preferential state.

To utilize a comparator of this type in a digital logic circuit, it is necessary to translate, or convert, the described states of the current outputs to logic level voltage signals. The interface circuit must have current inputs, for connection to the current outputs of the comparator, and a logic level voltage output for interfacing to logic circuits. When the comparator is in the preferential state (i.e., current is flowing in the first current input), the interface circuit assumes a first logic level at the voltage output. If the comparator input current is greater than the reference current when the strobe is activated, the comparator remains in the preferential state and no logic level transition occurs at the interface circuit voltage output. Thus, the logic switching time delay for this condition is essentially zero. If the comparator input current is less than the reference current when the strobe is activated, a transition to a second logic level voltage will take place at the voltage output of the interface circuit in response to the switching of current flows in the current inputs. Thus, a particularly advantageous circuit for this application is one in which the logic switching time delay for the transition from the first logic level voltage to the second logic level voltage has been minimized. This can be achieved at the expense of a relatively slow second-to-first logic level transition (i.e., the circuit recovery time), since recovery to the preferential state takes place between clock pulses when the comparator/interface circuit combination is not being called upon to make a decision. As will be discussed in detail below, the interface circuit of the present invention has these advantageous features.

Accordingly, it is an object of the present invention to provide a circuit for interfacing comparators, and other devices having current signal outputs, with digital logic circuits.

Another object of the present invention is to provide an interface circuit of relatively simple design which can be implemented with a minimal number of devices in a relatively small area.

Still another object of the present invention is to provide an interface circuit wherein the switching delay for a transition from a first logic level output to a second logic level output is minimized.

A further object of the present invention is to provide a circuit with a high immunity from noise and erroneous signals when the output is in the first logic level state.

A still further object of the present invention is to provide a circuit wherein the first-to-second logic level voltage transition time and the second-to-first logic level voltage recovery time are easily adjusted by altering the relative sizes of circuit components.

These and other objects of the invention are attained by a current-to-voltage interface circuit which produces a first logic level voltage at a logic voltage output when current flows in a first current input, and which produces a second logic level voltage at the logic voltage output when current flows in a second current input. The interface circuit comprises an input stage and a logic stage. The input stage has first and second current inputs and a voltage output. The logic stage has an input connected to the voltage output of the input stage, and an output at which logic level voltages are produced. The input stage comprises a first circuit, a second circuit, and a switching device. The first circuit includes the first current input, a first current source and voltage clamping element, and a first voltage output connected to the switching device. The second circuit includes the second current input, a second current source and voltage clamping element, and a second voltage output connected at a node to the switching device and to the input of the logic stage. The switching device is connected to a voltage source and, in response to a voltage produced at the first voltage output by the first circuit, connects the voltage source to the logic stage input. Logic level voltage transitions are produced at the logic stage output in response to the voltage changes produced at the node where the logic circuit input, the second voltage output and the switching device are connected. The first-to-second and second-to-first logic level voltage transition times are adjustable by selecting first and second transistors in the first circuit such that, when both transistors are biased with the same voltage, the current established in the first transistor will be a selected multiple of the current established in the second transistor.

BRIEF DESCRIPTION OF THE DRAWINGS

For a better understanding of the present invention, reference is made to the following detailed description of a preferred embodiment and the accompanying figures in which:

FIG. 1 shows the interface circuit of the present invention coupled to the current outputs of a high speed analog comparator; and FIG. 2 shows the voltage/time wave forms at several nodes within the interface circuit of FIG. 1.

FIG. 3 shows a timing diagram which illustrates the circuit transition times relative to the strobe signal and a clock signal.

DETAILED DESCRIPTION OF THE DRAWINGS

A preferred embodiment of the present invention is shown in FIG. 1. The interface circuit, generally indicated by reference numeral 10, is shown coupled to the current outputs of high speed analog comparator 14. Comparator 14 has an input terminal 16, a reference terminal 18, a strobe 20, and current outputs 22 and 24. In operation, comparator 14 compares the magnitude of the current at the input terminal 16 to a reference current at reference terminal 18. Under "normal" conditions, strobe 20 is not active and the output stage of comparator 14 goes into a preferential state in which approximately 500 microamps is sunk by current output 22, while approximately 0 microamps flows in current output 24. When strobe 20 is activated, comparator 14 can assume one of two states: (1) If the current flowing in input terminal 16 is greater than the reference current flowing in reference terminal 18, comparator 14 remains in its preferential state with approximately 500 microamps flowing in current output 22 and 0 microamps flowing in current output 24; (2) if the current flowing in input terminal 16 is less than the reference current, approximately 500 microamps is sunk by current output 24, while approximately 0 microamps flows in current output 22.

Interface circuit 10 includes an input stage, indicated generally by numeral 12, and a logic stage, indicated by numeral 13.

Current outputs 22 and 24 are coupled to input pads 23 and 25, respectively, which are also connected to current inputs 26 and 28 of input stage 12. Input stage 12 and logic stage 13 are connected to a voltage source, $V_L$, at pad 30, and to a voltage reference, $V_{REF}$, at pad 32. In the present embodiment, $V_L$ is approximately 5 volts and $V_{REF}$ is approximately 0 volts. Input stage 12 also has an output node 42 which is connected to the input of logic stage 13. Logic stage 13 has an output connected to pad 34 where logic level voltages are produced in response to currents flowing in current inputs 26 and 28, as will be explained in detail below.

Input stage 12 includes a first circuit which comprises current input 26, P-channel transistor 36, bipolar transistor 48, and an output voltage node 38. Input stage 12 also includes a second circuit which comprises current input 28, bipolar transistor 50, and an output voltage node 42. Input stage 12 further comprises a switching device, represented by P-channel transistor 40, which serves to connect node 42 to $V_L$ in response to a voltage produced by the first circuit at node 38.

When comparator 14 is in its preferential state (i.e., approximately 500 microamps flowing into output 22 and substantially zero current flowing in output 24), current is supplied to current input 26 by P-channel transistor 36 which is connected at its source to $V_L$, and which is connected at its gate and drain to current input 26 at node 38. Node 38 is also connected to the gate of P-channel transistor 40. The source of transistor 40 is connected to $V_L$, while the drain is connected to current input 28 at node 42. Node 42 is connected to the input of logic stage 13 which comprises an inverter formed by complementary transistors 44 and 46. The source of transistor 44 is connected to $V_L$, the drain of transistor 44 and drain of transistor 46 are connected together at output pad 34, and the source of transistor 46 is connected to $V_{REF}$. The gates of transistors 44 and 46 are connected together at node 42.

The remaining components making up interface circuit 12 are bipolar transistors 48 and 50. Although transistors 48 and 50 are shown as NPN devices, it should be readily apparent that PNP devices could also be used. The collectors of these transistors are connected to $V_L$, their bases are connected to $V_{REF}$, and their emitters are connected, respectively, to nodes 38 and 42 (current inputs 26 and 28). When a CMOS process is used to produce field effect transistors 36, 40, 44 or 46, transistors 48 and 50 are preferably NPN substrate transistors. When connected as shown in FIG. 1, they function as protective voltage clamps to prevent nodes 38 and 42 from being pulled below minus 0.7 volts when a sudden demand for current is made from one of the comparator outputs and as back-up (transistor 48) and primary (transistor 50) current source elements. The NPN substrate transistor produced by the CMOS process is often connected in this, or a similar fashion, to protect CMOS devices from latching-up. This problem results when the substrate is driven to a low enough potential to forward bias a substrate junction. Current flowing in this junction can remain after removal of the voltage, causing damage to the CMOS devices.

The circuit operation will now be described. When the comparator is in the preferential state, a constant current of approximately 500 microamps is demanded from current input 26, while substantially zero current flows in current input 28. The 500 microamps is supplied by transistor 36. Transistor 36 is connected as a resistor and is of sufficient size to supply the required current. It should be noted at this point, that if more current is demand from current input 26 than transistor 36 can supply, transistor 48 will supply the balance. As more current is conducted by transistor 36, the voltage drop across this transistor increases and, accordingly, the voltage at node 38 decreases. When the voltage reaches $-0.7$ volts, i.e., for a voltage drop across transistor 36 of 5.7 volts, transistor 48 turns on to supply the remaining current. Transistor 48 thus sets, at $-0.7$ volts, the minimum voltage to which node 38 can fall. Referring to FIG. 2, it can be seen that the lowest voltage to which node 38 falls in this particular embodiment is approximately 1.2 volts. Thus, under these particular circuit conditions, transistor 48 will not be called upon to supply current.

As noted, the current through transistor 36 establishes a voltage of approximately 1.2 V at node 38. This relatively low voltage turns on transistor 40 and connects node 42 to $V_L$. No current flows through transistor 40 at this time since none is demanded from current input 28. The high voltage level at node 42 turns on transistor 46 and, thus, provides a low logic level voltage at output pad 34.

This is the state of interface circuit 10 which corresponds to the preferential state of comparator 14. The voltages at nodes 34, 38 and 42 are shown in FIG. 2 for this preferential state, which corresponds to the interval marked 54 in FIG. 2. For purposes of clarity the waveforms in FIG. 2 are marked by the number of the node represented. Of the remaining intervals, 52 indicates the recovery time from the non-preferential to the preferential state (from high-to-low logic level output voltage), 56 indicates the transition time from the preferential state to the non-preferential state (low-to-high logic level output voltage), and 58 indicates the non-preferential, or high output, state.

When the comparator changes state, current ceases to flow in current input 26 and approximately 500 microamps is demanded from current input 28. At the instant of transition, transistor 40 is turned on and its gate is biased by the voltage at node 38. Transistor 40 is selected so that, when biased at this level, preferably on a linear portion of the characteristic curve, it will supply approximately 50 microamps, or about 1/10 of that being supplied by transistor 36 whose gate is similarly biased. In short, transistor 40 is chosen to be 1/10 the size of transistor 36. Thus, at the moment of transition, approximately 500 microamps will be demanded from current input 28, and approximately 50 microamps will be available from transistor 40. The net current flowing out of node 42 (approximately 450 microamps) will be large enough to rapidly drain the capacitances associated with this node and cause the node voltage to drop rapidly. This is apparent from waveform 42, interval 56, in FIG. 2. As seen there, the voltage at node 42 continues to drop until, at approximately −0.7 volts, transistor 50 is turned on to supply the current demanded and clamp the node voltage at this level. By selecting transistor 40 to be larger or smaller, this transition time (interval 56) can be increased or decreased, respectively.

The rapid drop in voltage at node 42 turns transistor 46 off and turns transistor 44 on producing a logic level transition at node 34 to a logic high level. The low-to-high transition at node 34 is very rapid, as can be seen in FIG. 2, while the high-to-low transition is relatively slow. This is an intentional result accomplished by increasing the size of transistor 44, relative to transistor 46, to insure that, as with input stage 12, the more rapid transition of logic stage 13 occurs when the comparator switches from the preferential to the non-preferential state.

When the comparator outputs revert to the preferential state, the interface circuit recovers as indicated by interval 52 in FIG. 2. For this preferred embodiment, the recovery time is relatively slow due to the relatively small size of transistor 40 and the correspondingly long time needed to charge the capacitances associated with node 42. This recovery time can be shortened by increasing the size of transistor 40 (which will lengthen the transition time as described above), or by decreasing the size of transistor 36 to decrease the bias voltage, and thus increase the current through, transistor 40. Thus, by adjusting the relative sizes of transistors 36 and 40, the transition time and recovery time of the input stage 12 can be altered. Similarly, adjusting the relative sizes of transistors 44 and 46 will alter the recovery time of logic stage 13.

FIG. 3 illustrates the manner in which the comparator and interface circuit combination interacts with an external circuit. Starting at the left of FIG. 3, the voltage waveforms at nodes 42 and 38 are shown with the comparator in the preferential state. The first strobe pulse occurs when the input current is presumed to be higher than the reference current and the comparator does not change states and the waveforms at nodes 38 and 42 do not change. Thus, when the external clock pulse arrives an interval of time 60 after strobe activation, a logic level low signal is present at node 38 as an input to the external circuitry. The switching delay time for the interface circuit in this case is zero.

Following time interval 62, a second strobe pulse occurs. Assuming the current in input terminal 16 is less than the reference current, a change of state will result. Time interval 64 represents the time necessary for the comparator to react to the strobe signal, and time interval 66 represents the interface circuit transition time (time interval 66 in FIG. 3 corresponds to time interval 56 in FIG. 2). As can be seen, the transitions at nodes 38 and 42 occur before the arrival of the clock pulse represented by interval 68. Recovery to the preferential state occurs in the relatively long time interval 70. Thus, the strobe and clock pulses, along with the circuit noise they are capable of producing, are confined to relatively brief intervals, separated by longer, relatively quiet intervals represented by 62 and 70 in FIG. 3. Since recovery to the preferential state occurs in these relatively long intervals, the circuit can be designed to optimize the speed of the preferential-to-nonpreferential transition, thus, optmizing the overall decision making speed of the circuit.

Although this invention has been described and illustrated in detail, it is to be clearly understood that this description is not to be taken by way of limitation. The spirit and scope of the invention are to be limited only by the terms of the appended claims.

What is claimed is:

1. A current-to-voltage interface circuit, comprising a voltage source input, first and second current inputs, a logic voltage output, and means for producing a first logic level voltage at said logic voltage output in response to current flowing in said first current input and for producing a second logic level voltage at said logic voltage output in response to current flowing in said second current input.

2. A current-to-voltage interface circuit according to claim 1, wherein a logic low voltage level is produced at said logic voltage output when a current is flowing in said first current input and substantially zero current is flowing in said second current input.

3. A current-to-voltage interface circuit according to claim 1, wherein a high voltage level is produced at said logic voltage output when a current is flowing in said second current input and substantially zero current is flowing in said first current input.

4. A current-to-voltage interface circuit according to claim 1, wherein a switching time for a transition from said first logic level voltage to said second logic level voltage is substantially shorter than a switching time for a transition from said second logic level voltage to said first logic level voltage.

5. A current-to-voltage interface circuit according to claim 1, wherein said currents flowing in said first and second current inputs are less than approximately 500 microamps.

6. A current-to-voltage interface circuit, comprising:
a voltage source input;
first and second current inputs;
a logic voltage output;
input circuit means, connected to said voltage source input and to said first and second current inputs and having a voltage output, for producing a first voltage level at said voltage output in response to a current flowing in said first current input and for producing a second voltage level at said voltage output in response to current flowing in said second current input; and logic means, connected to said voltage source input and having an input connected to said voltage output of said input circuit means and having an output connected to said logic voltage output, for producing first and second logic level voltages at said logic voltage output in response to said first and second voltage levels at said voltage output of said input circuit means.

7. A current-to-voltage interface circuit according to claim 6, wherein said input circuit means includes current source means for supplying a current to said first current input.

8. A current-to-voltage interface circuit, comprising:
a voltage source input;
first and second current inputs;
a logic voltage output;
input circuit means, connected to said voltage source input and to said first and second current inputs and having a voltage output, for producing a first voltage level at said voltage output in response to a current flowing in said first current input and for producing a second voltage level at said voltage output in response to current flowing in said second current input; and
logic means, connected to said voltage source input and having an input connected to said voltage output of said input circuit means and having an output connected to said logic voltage output, for producing first and second logic level voltages at said logic voltage output in response to said first and second voltage levels at said voltage output of said input circuit means;
wherein said input circuit means includes current source means for supplying a current to said first current input; and
wherein said current source means includes a first field effect transistor having a source connected to said voltage source input, and having a gate and a drain connected together and to said first current input.

9. A current-to-voltage interface circuit according to claim 8, wherein a voltage drop of less than approximately 5.7 volts is produced across said first field effect transistor when said first field effect transistor supplies said current to said first current input.

10. A current-to-voltage interface circuit, comprising:
a voltage source input;
first and second current inputs;
a logic voltage output;
input circuit means, connected to said voltage source input and to said first and second current inputs and having a voltage output, for producing a first voltage level at said voltage output in response to a current flowing in said first current input and for producing a second voltage level at said voltage output in response to current flowing in said second current input; and
logic means, connected to said voltage source input and having an input connected to said voltage output of said input circuit means and having an output connected to said logic voltage output, for producing first and second logic level voltages at said logic voltage output in response to said first and second voltage levels at said voltage output of said input circuit means; and
wherein said input circuit means includes first clamping means for preventing said first current input from falling below a selected voltage potential.

11. A current-to-voltage interface circuit according to claim 10, wherein said selected voltage potential is approximately −0.7 volts.

12. A current-to-voltage interface circuit according to claim 10, wherein said first clamping means is a bipolar transistor having a collector connected to a voltage source, and having a base connected to a reference potential, and having an emitter connected to said first current input.

13. A current-to-voltage interface circuit according to claim 12, wherein said input circuit means includes an MOS device and wherein said bipolar transistor is an NPN substrate transistor.

14. A current-to-voltage interface circuit according to claim 10, wherein said input circuit means includes second clamping means for preventing said second current input from falling below a selected voltage potential.

15. A current-to-voltage interface circuit according to claim 14, wherein said selected voltage potential is approximately −0.7 volts.

16. A current-to-voltage interface circuit according to claim 14, wherein said second clamping means is a bipolar transistor having a collector connected to a voltage source, and having a base connected to a reference potential, and having an emitter connected to said second current input.

17. A current-to-voltage interface circuit according to claim 16, wherein said input circuit means includes a MOS device and wherein said bipolar transistor is an NPN substrate transistor.

18. A current-to-voltage interface circuit according to claim 8, wherein said input circuit means includes switching means, responsive to a voltage established on said first current input by said current flowing in said first current input, for connecting said voltage output to a voltage source.

19. A current-to-voltage interface circuit according to claim 18, wherein said switching means is a second field effect transistor having a source connected to said voltage source, a gate connected to said first current input and a drain connected to said voltage output.

20. A current-to-voltage interface circuit according to claim 19, wherein said first and second field effect transistors are selected such that a first current which would flow in said first field effect transistor when said first gate is biased by a first voltage potential is a multiple of a second current which would flow in said second field effect transistor when said second gate is biased by said first voltage potential.

21. A current-to-voltage interface circuit according to claim 20, wherein said multiple is approximately 10.

22. A current-to-voltage interface circuit according to claim 6, wherein said logic means includes an inverter.

23. A current-to-voltage interface circuit according to claim 22, wherein said inverter includes first and second field effect transistors, each having a gate connected to said input of said logic means; and said first transistor having a source connected to said voltage source input and a drain connected to said logic voltage output, and said second transistor having a drain connected to said logic voltage output and a source connected to a reference potential, said first transistor being larger, with respect to current carrying capacity, than said second transistor.

24. A current-to-voltage interface circuit, comprising:
   a voltage source input;
   first and second current inputs;
   a logic voltage output;
   first current source means, connected to said voltage source input and to said first current input, for supplying a current to said first current input and for preventing said first current input from falling below a selected first voltage potential;
   second current source means, connected to said voltage source input and to said second current input, for supplying a current to said second current input and for preventing said second current input from falling below a selected second voltage potential;
   switching means responsive to said selected first voltage potential, for connecting said second current input to said voltage source input; and
   logic means, connected to said voltage source input and having an input connected to said second current input and having an output connected to said logic voltage output, for producing a first logic level voltage at said logic voltage output in response to said selected second voltage potential, and for producing a second logic level voltage at said logic voltage output in response to connection of said second current input to said voltage source input by said switching means.

25. A current-to-voltage interface circuit according to claim 24, wherein said first current source means includes a first field effect transistor having a source connected to said voltage source input and having a first gate and a drain connected together and to said first current input.

26. A current-to-voltage interface circuit according to claim 25, wherein said switching means includes a second field effect transistor having a source connected to said voltage source input, and having a gate connected to said first current input, and having a drain connected to said second current input.

27. A current-to-voltage interface circuit according to claim 26, wherein said first and second field effect transistors are selected such that a first current which would flow in said first field effect transistor when said first gate is biased by said selected first voltage potential is a multiple of a second current which would flow in said second field effect transistor when said second gate is biased by said selected first voltage potential.

28. A current-to-voltage interface circuit according to claim 27, wherein said multiple is approximately 10.

29. A current-to-voltage interface circuit according to claim 24, wherein said logic means includes an inverter.

30. A current-to-voltage interface circuit according to claim 29, wherein said inverter includes first and second field effect transistors, each having a gate connected to said input of said logic means; and said first transistor having a source connected to said voltage source input and a drain connected to said logic voltage output, and said second transistor having a source connected to said logic voltage output and a drain connected to a reference potential, said first transistor being larger, with respect to current carrying capacity, than said second transistor.

31. A current-to-voltage interface circuit, comprising:
   first circuit means, connected to a voltage source and having a first current input and a first voltage output, for producing a first voltage at said first voltage output in response to a current flowing in said first current input;
   second circuit means, connected to said voltage source and having a second current input and a second voltage output, for producing a second voltage at said second voltage output in response to a current flowing in said second current input;
   logic circuit means, connected to said voltage source and having a logic voltage output and a logic input, said logic input being connected to said second voltage output, for producing respectively, first and second logic level voltages at said logic voltage output in response to said second voltage and a third voltage at said logic input; and
   switching means, connected to said logic input, to said voltage source and to said first voltage output, for producing at said logic input said third voltage in response to said first voltage.

32. A current-to-voltage interface circuit according to claim 31, wherein said first circuit means includes a first current source for supplying current to said first current input and for preventing said first current input from falling below a selected first voltage potential.

33. A current-to-voltage interface circuit according to claim 32, wherein said second circuit means includes a second current source for supplying current to said second current input and for preventing said second current input from falling below a selected second voltage potential.

34. An interface circuit, comprising:
   a comparator having a first current input, a reference current input, a strobe input, and first and second current outputs, said comparator having a preferential state in which current flows in said first current output and substantially zero current flows in said second current output, and having a nonpreferential state in which current flows in said second current output and substantially zero current flows in said first current output; and
   circuit means, having a voltage source input, first and second current inputs connected to the first and second current outputs of the comparator, and a logic voltage output, for producing a first logic level voltage at said logic voltage output when said comparator is in said preferential state and for producing a second logic level voltage at said logic voltage output when said comparator is in said nonpreferential state.

35. An interface circuit according to claim 34, wherein a switching time for a transition from the first to the second logic level voltage is substantially shorter than a switching time for a transition from the second to the first logic level voltage.

* * * * *